(12) United States Patent
Van Brunt et al.

(10) Patent No.: US 11,600,724 B2
(45) Date of Patent: Mar. 7, 2023

(54) EDGE TERMINATION STRUCTURES FOR SEMICONDUCTOR DEVICES

(71) Applicant: Wolfspeed, Inc., Durham, NC (US)

(72) Inventors: Edward Robert Van Brunt, Raleigh, NC (US); Thomas E. Harrington, III, Carrollton, TX (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/031,365

(22) Filed: Sep. 24, 2020

(65) Prior Publication Data
US 2022/0093791 A1    Mar. 24, 2022

(51) Int. Cl.
  *H01L 29/78* (2006.01)
  *H01L 29/06* (2006.01)
  *H01L 29/16* (2006.01)

(52) U.S. Cl.
  CPC ...... *H01L 29/7823* (2013.01); *H01L 29/0615* (2013.01); *H01L 29/1608* (2013.01)

(58) Field of Classification Search
  CPC ............. H01L 29/7823; H01L 29/0615; H01L 29/1608
  See application file for complete search history.

(56) References Cited

U.S. PATENT DOCUMENTS

| | | | |
|---|---|---|---|
| 9,425,265 B2 | 8/2016 | Van Brunt et al. | |
| 9,484,413 B2 | 11/2016 | Van Brunt et al. | |
| 9,515,135 B2 | 12/2016 | Ryu et al. | |
| 9,570,560 B2 | 2/2017 | Zhang et al. | |
| 9,647,077 B2 * | 5/2017 | Sin | H01L 29/7816 |
| 2010/0025820 A1 | 2/2010 | Suekawa | |
| 2014/0197476 A1 | 7/2014 | Shimatou | |

(Continued)

FOREIGN PATENT DOCUMENTS

| | | |
|---|---|---|
| JP | 2004158844 A | 6/2004 |
| JP | 2008227236 A | 9/2008 |

OTHER PUBLICATIONS

Philipp Steinmann et al., U.S. Appl. No. 16/806,489, filed Mar. 2, 2020, entitled "Semiconductor Die With Improved Edge Termination".

(Continued)

*Primary Examiner* — Syed I Gheyas
(74) *Attorney, Agent, or Firm* — Myers Bigel, P.A.

(57) ABSTRACT

Semiconductor devices, and more particularly semiconductor devices with improved edge termination structures are disclosed. A semiconductor device includes a drift region that forms part of an active region. An edge termination region is arranged along a perimeter of the active region and also includes a portion of the drift region. The edge termination region includes one or more sub-regions of an opposite doping type than the drift region and one or more electrodes may be capacitively coupled to the drift region by way of the one or more sub-regions. During a forward blocking mode for the semiconductor device, the one or more electrodes may provide a path that draws ions away from passivation layers that are on the edge termination region and away from the active region. In this manner, the semiconductor device may exhibit reduced leakage, particularly at higher operating voltages and higher associated operating temperatures.

27 Claims, 10 Drawing Sheets

(56) References Cited

U.S. PATENT DOCUMENTS

| | | | |
|---|---|---|---|
| 2015/0349051 A1* | 12/2015 | Uchida | H01L 29/0619 257/77 |
| 2016/0093748 A1 | 3/2016 | Mieczkowski et al. | |
| 2016/0351657 A1* | 12/2016 | Senoo | H01L 29/404 |
| 2017/0110560 A1* | 4/2017 | Kato | H01L 29/7396 |
| 2017/0256503 A1 | 9/2017 | Fujii | |
| 2017/0338335 A1 | 11/2017 | Takaoka | |
| 2018/0061951 A1* | 3/2018 | Kitamura | H01L 29/0619 |
| 2018/0226474 A1* | 8/2018 | Shimizu | H01L 29/1608 |
| 2019/0287962 A1 | 9/2019 | Naito | |
| 2019/0305140 A1* | 10/2019 | Morimoto | H01L 29/0619 |

OTHER PUBLICATIONS

International Search Report and Written Opinion for International Patent Application No. PCT/US2021/051439, dated Dec. 22, 2021, 17 pages.

* cited by examiner

EDGE TERMINATION STRUCTURES FOR SEMICONDUCTOR DEVICES

FIELD OF THE DISCLOSURE

The present disclosure is related to semiconductor devices, and in particular to semiconductor devices with improved edge termination.

BACKGROUND

Semiconductor devices such as transistors and diodes are ubiquitous in modern electronic devices. Wide bandgap semiconductor material systems such as gallium arsenide (GaAs), gallium nitride (GaN), and silicon carbide (SiC) are being increasingly utilized in semiconductor devices to push the boundaries of device performance in areas such as switching speed, power handling capability, and thermal conductivity. Examples include individual devices such as metal-oxide-semiconductor field-effect transistors (MOSFETs), insulated gate bipolar transistors (IGBTs), Schottky barrier diodes, PiN diodes, high electron mobility transistors (HEMTs), and integrated circuits such as monolithic microwave integrated circuits (MMICs) that include one or more individual devices.

Semiconductor devices are typically formed in an active region of a semiconductor die. In semiconductor die manufactured to support high voltages and currents, concentration of electric fields can interfere with the proper operation thereof. Concentration of electric fields is especially problematic at edges of the semiconductor die. Accordingly, an edge termination region surrounds the active region about a perimeter of the semiconductor die to reduce electric fields at the edges of the die. Without an edge termination region, electric fields would concentrate at the edges of the die and cause the performance of the die to suffer. For example, the breakdown voltage, leakage current, and/or reliability of the die may be significantly reduced. Specifically, the die may suffer from leakage current under reverse bias when subject to thermal stress (e.g., temperatures greater than 150° C.) that may be associated with higher operating voltages. While several edge termination structures have been proposed for reducing the concentration of electric fields at the edges of a die, many of the proposed structures are unable to reduce the concentration of electric fields to a desired level, particularly in higher temperature and higher voltage operating conditions.

The art continues to seek improved edge termination structures for semiconductor devices capable of overcoming challenges associated with conventional semiconductor devices.

SUMMARY

The present disclosure relates to semiconductor devices, and more particularly to semiconductor devices with improved edge termination structures. A semiconductor device may include a drift region that forms part of an active region. An edge termination region is arranged along a perimeter of the active region and may also include a portion of the drift region. The edge termination region may include one or more sub-regions of an opposite doping type than the drift region and one or more electrodes may be capacitively coupled to the drift region by way of the one or more sub-regions. During a forward blocking mode for the semiconductor device, the one or more electrodes may provide a path that draws ions away from passivation layers that are on the edge termination region and away from the active region. In this manner, the semiconductor device may exhibit reduced leakage, particularly at higher operating voltages and higher associated operating temperatures.

In one aspect, a semiconductor device comprises: a drift region comprising a first doping type; an active region comprising a portion of the drift region; an edge termination region in the drift region and arranged along a perimeter of the active region, the edge termination region comprising a sub-region of a second doping type that is opposite the first doping type; and a first electrode connected to the sub-region wherein the first electrode is capacitively coupled to the drift region when the semiconductor device is electrically activated. In certain embodiments, the sub-region is a first sub-region of a plurality of sub-regions, and the first sub-region is arranged closer to a peripheral edge of the drift region than any other sub-region of the plurality of sub-regions. The first electrode may form an electrode ring that is arranged around the perimeter of the active region. In certain embodiments, the semiconductor device further comprises a first passivation layer on the edge termination region. The first passivation layer may form an opening and the first electrode may contact the sub-region through the first passivation layer. In certain embodiments, the semiconductor device further comprises an additional passivation layer on the first passivation layer, wherein the first electrode is arranged between the additional passivation layer and the drift region. In certain embodiments, the sub-region comprises a first guard ring in the edge termination region. The first guard ring may be one of a plurality of guard rings in the edge termination region. In certain embodiments, the first guard ring of the plurality of guard rings is arranged closer to a peripheral edge of the drift region than any other guard ring of the plurality of guard rings.

The semiconductor device may further comprise a second electrode that is connected to a second guard ring of the plurality of guard rings, wherein the second electrode is capacitively coupled to the drift region when the semiconductor device is electrically activated. In certain embodiments, the semiconductor device further comprises: a second electrode that is connected to the drift region outside a periphery of the plurality of guard rings, wherein the second electrode is coupled to a drain potential when the semiconductor device is electrically activated; and a third electrode that is connected to a second guard ring of the plurality of guard rings, wherein the third electrode is capacitively coupled to the drift region when the semiconductor device is electrically activated. In certain embodiments, the semiconductor device further comprises a second electrode that is connected to the drift region outside a periphery of the plurality of guard rings, wherein the second electrode is coupled to a drain potential when the semiconductor device is electrically activated, with or without the above-mentioned third electrode.

The semiconductor device may further comprise a surface depletion protection region in the edge termination region, the surface depletion protection region comprising the first doping type with a higher doping concentration than the drift region; wherein the second electrode is connected to the surface depletion protection region. In certain embodiments, the semiconductor device further comprises a first passivation layer on the edge termination region, wherein the first passivation layer forms an opening and the second electrode contacts the surface depletion protection region through the first passivation layer. In certain embodiments, the second electrode contacts the surface depletion protection region outside a peripheral edge of the first passivation layer. In certain embodiments, the sub-region comprises a junction termination extension. In certain embodiments, the sub-region further comprises one or more guard rings.

The semiconductor drift region of the semiconductor device may comprise silicon carbide (SiC). In certain embodiments, the active region comprises a SiC metal-oxide-semiconductor field-effect-transistor (MOSFET).

In another aspect, a semiconductor device comprises: a drift region comprising a first doping type; an active region comprising a portion of the drift region; an edge termination region in the drift region and arranged along a perimeter of the active region, the edge termination region comprising a sub-region of a second doping type that is opposite the first doping type; a first passivation layer on the edge termination region, the first passivation layer forming an opening that is registered with the sub-region; and a first electrode connected to the sub-region through the opening of the first passivation layer. The semiconductor device may further comprise a second passivation layer on the first passivation layer, wherein the first passivation layer and the second passivation layer form the opening and the first electrode is connected to the sub-region through the first passivation layer and the second passivation layer. The semiconductor device may further comprise a third passivation layer on the second passivation layer, wherein the third passivation layer covers the first electrode. The semiconductor device may further comprise a fourth passivation layer on the third passivation layer. In certain embodiments, one or more of the first passivation layer and the second passivation layer comprises an oxide, the third passivation layer comprises silicon nitride, and the fourth passivation layer comprises a polyimide. In certain embodiments, the sub-region comprises a first guard ring in the edge termination region. In certain embodiments, the first guard ring is one of a plurality of guard rings in the edge termination region, and the first guard ring of the plurality of guard rings is arranged closer to a peripheral edge of the drift region than any other guard ring of the plurality of guard rings. The semiconductor device may further comprise a second electrode that is connected to a second guard ring of the plurality of guard rings. The semiconductor device may further comprise a second electrode that is connected to the drift region outside a periphery of the plurality of guard rings and a third electrode that is connected to a second guard ring of the plurality of guard rings. In certain embodiments, the sub-region comprises a junction termination extension.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
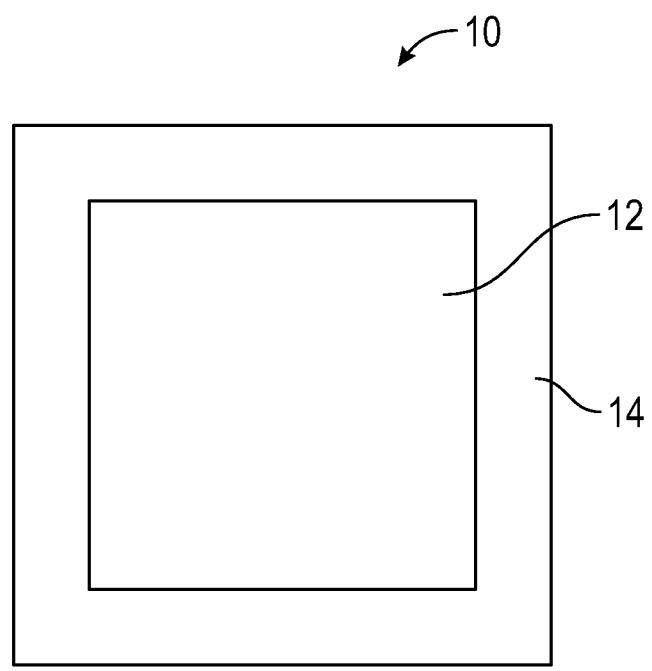
FIG. 1A is a top view illustration of an exemplary semiconductor device according to the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to semiconductor devices, and more particularly to semiconductor devices with improved edge termination structures. A semiconductor device may include a drift region that forms part of an active region. An edge termination region is arranged along a perimeter of the active region and may also include a portion of the drift region. The edge termination region may include one or more sub-regions of an opposite doping type than the drift region and one or more electrodes may be capacitively coupled to the drift region by way of the one or more sub-regions. During a forward blocking mode for the semiconductor device, the one or more electrodes may provide a path that draws ions away from passivation layers that are on the edge termination region and away from the active region. In this manner, the semiconductor device may exhibit reduced leakage, particularly at higher operating voltages and higher associated operating temperatures.

FIG. 1A is a top view illustration of an exemplary semiconductor device 10 according to the present disclosure. The semiconductor device 10 includes an active region 12 and an edge termination region 14 surrounding the active region 12 about a perimeter of the semiconductor device 10. Depending on the particular application, the active region 12 may include one or more semiconductor devices formed therein, such as one or more metal-oxide-semiconductor field-effect transistors (MOSFETs), diodes, Schottky diodes, junction barrier Schottky (JBS) diodes, PiN diodes, and insulated gate bipolar transistors (IGBTs), among others. The semiconductor device may embody wide band gap semiconductor devices, for example silicon carbide (SiC)-based devices. The edge termination region 14 reduces a concentration of an electric field at the edges of the semiconductor device 10 in order to improve the performance thereof. For example, the edge termination region 14 may increase a breakdown voltage of the semiconductor device 10, may decrease a leakage current of the semiconductor device 10 over time, and the like as discussed in detail below. By way of example, the edge termination region 14 may include one or more guard rings, a junction termination extension (JTE), and combinations thereof.

Figure 1B:
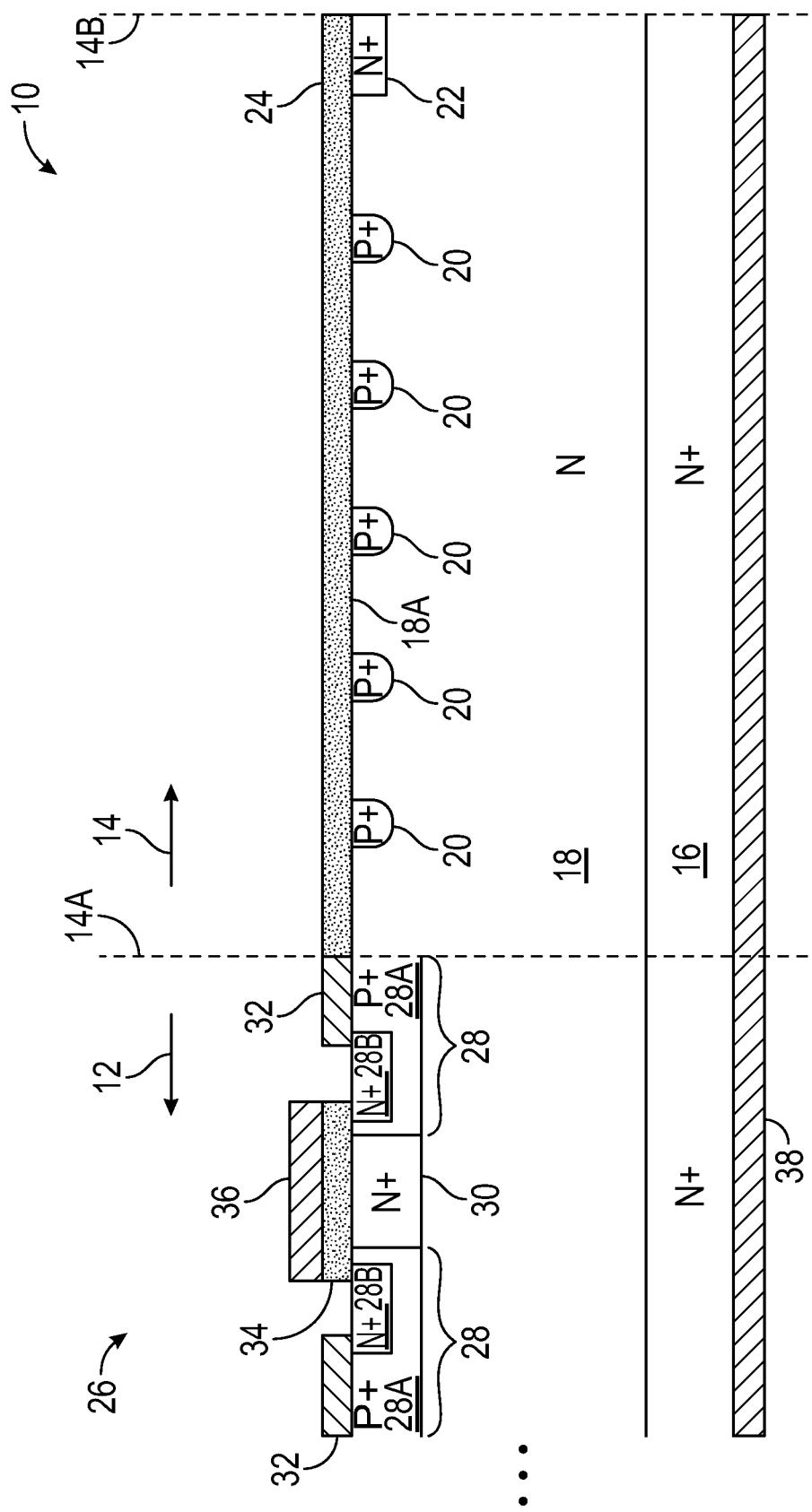
FIG. 1B illustrates a cross-sectional view of a portion of the semiconductor device of FIG. 1A for embodiments where the semiconductor device includes a MOSFET.

FIG. 1B illustrates a cross-sectional view of a portion of the semiconductor device 10 of FIG. 1A for embodiments where the semiconductor device 10 includes a MOSFET. While an exemplary MOSFET is described, the principles of the present disclosure are applicable to other semiconductor devices listed above, including diodes, Schottky diodes, JBS diodes, PiN diodes, and IGBTs, among others. The semiconductor device 10 includes a substrate 16 and a drift region 18 on the substrate 16. The drift region 18 may embody one or more drift layers of a wide band gap semiconductor material, for example SiC. An inside edge 14A of the edge termination region 14 is indicated by a vertical dashed line to delineate the edge termination region 14 from the active region 12. An outside edge 14B of the edge termination region 14 may correspond with a peripheral edge of the semiconductor device 10. In the edge termination region 14, a number of guard rings 20 are provided in the drift region 18. Specifically, the guard rings 20 are provided adjacent or even directly adjacent a top surface 18A of the drift region 18 opposite the substrate 16. The guard rings 20 may be formed by ion implantation and the implants used may include aluminum (Al), boron (B), or any other suitable p-type dopant when the drift region 18 is configured as an n-type layer. Each guard ring 20 forms a sub-region in the edge termination region 14 that has a doping type that is opposite a doping type of the drift region 18. In the present example, the drift region 18 is an n-type layer while the guard rings 20 are p-type sub-regions. However, the principles of the present disclosure apply equally to devices with opposite polarity configurations where the doping types as illustrated in FIG. 1B may be reversed.

When a voltage is supported by the drift region 18, electric field concentration at the outside edge 14B of the edge termination region 14 tends to be substantially higher than at the inside edge 14A of the edge termination region 14. In certain embodiments, a surface depletion protection region 22 may also be provided in the drift region 18 at the outside edge 14B of the edge termination region 14. The surface depletion protection region 22 may have the same doping type as the drift region 18 but a higher doping concentration than that of the drift region 18. In this manner, the surface depletion protection region 22 may prevent depletion at the top surface 18A of the drift region 18 in order to further improve the performance of the semiconductor device 10. In certain embodiments, the surface depletion protection region 22 is provided by implantation. A passivation layer 24 may be provided on the top surface 18A of the drift region 18 opposite the substrate 16 to passivate the top surface 18A of the drift region 18. The passivation layer 24 may embody one or more layers of insulating materials of any suitable material, for example one or more layers of oxide and/or nitride-based dielectric layers. In certain embodiments, the passivation layer 24 may embody a multilayer structure that includes one or more of a field oxide layer, one or more intermetal dielectric layers, and a top insulating layer.

The substrate 16 may have a doping concentration between $1 \times 10^{17}$ cm$^{-3}$ and $1 \times 10^{20}$ cm$^{-3}$. In various embodiments, the doping concentration of the substrate 16 may be provided at any subrange between $1 \times 10^{17}$ cm$^{-3}$ and $1 \times 10^{20}$ cm$^{-3}$. For example, the doping concentration of the substrate 16 may be between $1 \times 10^{18}$ cm$^{-3}$ and $1 \times 10^{20}$ cm$^{-3}$, between $1 \times 10^{19}$ cm$^{-3}$ and $1 \times 10^{20}$ cm$^{-3}$, between $1 \times 10^{17}$ cm$^{-3}$ and $1 \times 10^{19}$ cm$^{-3}$, between $1 \times 10^{17}$ cm$^{-3}$ and $1 \times 10^{18}$ cm$^{-3}$, and between $1 \times 10^{18}$ cm$^{-3}$ and $1 \times 10^{19}$ cm$^{-3}$.

The drift region 18 may have a doping concentration between $1 \times 10^{14}$ cm$^{-3}$ and $1 \times 10^{18}$ cm$^{-3}$. In various embodiments, the doping concentration of the drift region 18 may be provided at any subrange between $1 \times 10^{14}$ cm$^{-3}$ and $1 \times 10^{18}$ cm$^{-3}$. For example, the doping concentration of the drift region 18 may be between $1 \times 10^{15}$ cm$^{-3}$ and $1 \times 10^{18}$ cm$^{-3}$, between $1 \times 10^{16}$ cm$^{-3}$ and $1 \times 10^{18}$ cm$^{-3}$, between $1 \times 10^{17}$ cm$^{-3}$ and $1 \times 10^{18}$ cm$^{-3}$, between $1 \times 10^{14}$ cm$^{-3}$ and $1 \times 10^{17}$ cm$^{-3}$, between $1 \times 10^{14}$ cm$^{-3}$ and $1 \times 10^{16}$ cm$^{-3}$, between $1 \times 10^{14}$ cm$^{-3}$ and $1 \times 10^{15}$ cm$^{-3}$, between $1 \times 10^{15}$ cm$^{-3}$ and $1 \times 10^{17}$ cm$^{-3}$, between $1 \times 10^{15}$ cm$^{-3}$ and $1 \times 10^{16}$ cm$^{-3}$, and between $1 \times 10^{16}$ cm$^{-3}$ and $1 \times 10^{17}$ cm$^{-3}$. The surface depletion protection region 22 may have a doping concentration that is higher than the doping concentration of the drift region 18. In various embodiments, the surface depletion protection region 22 may have a doping concentration in a range from two times to $10^5$ times the doping concentration of the drift region 18.

The guard rings 20 may have a doping concentration between $5 \times 10^{18}$ cm$^{-3}$ and $1 \times 10^{21}$ cm$^{-3}$. In various embodiments, the doping concentration of the guard rings 20 may be provided at any subrange between $5 \times 10^{18}$ cm$^{-3}$ and $1 \times 10^{21}$ cm$^{-3}$. For example, the doping concentration of the guard rings 20 may be between $5 \times 10^{19}$ cm$^{-3}$ and $1 \times 10^{21}$ cm$^{-3}$, between $5 \times 10^{20}$ cm$^{-3}$ and $1 \times 10^{21}$ cm$^{-3}$, between $5 \times 10^{18}$ cm$^{-3}$ and $1 \times 10^{20}$ cm$^{-3}$, between $5 \times 10^{18}$ cm$^{-3}$ and $1 \times 10^{19}$ cm$^{-3}$, and between $5 \times 10^{19}$ cm$^{-3}$ and $1 \times 10^{20}$ cm$^{-3}$.

As discussed above, the active region 12 may include one or more semiconductor devices. In the example of FIG. 1B, the active region 12 includes at least one MOSFET cell 26, for example a SiC-based MOSFET where the drift region 18 embodies one or more layers of SiC. The MOSFET cell 26 includes the substrate 16 and the drift region 18. A number of junction implants 28 are provided in the drift region 18, and specifically in the top surface 18A of the drift region 18 opposite the substrate 16. The junction implants 28 include a first well region 28A having a doping type that is opposite that of the drift region 18 and a second well region 28B having a doping type that is the same as the drift region 18. The junction implants 28 are separated from one another by a JFET region 30. The JFET region 30 has the same doping type as that of the drift region 18 and a higher doping concentration than that of the drift region 18. A source contact 32 is provided over each one of the junction implants 28 on the top surface 18A of the drift region 18 opposite the substrate 16 such that the source contact 32 contacts a portion of the first well region 28A and the second well region 28B. A gate oxide layer 34, or insulating material depending on the device type, is provided on the top surface 18A of the drift region 18 opposite the substrate 16 over the JFET region 30 and a portion of each one of the junction implants 28 such that the gate oxide layer 34 partially overlaps each one of the second well regions 28B. A gate contact 36 is provided on the gate oxide layer 34. A drain contact 38 is provided on a surface of the substrate 16 opposite the drift region 18. The MOSFET cell 26 may be tiled across the active region 12 or tiled in a desired pattern with one or more other semiconductor devices (e.g., diodes) to provide a desired functionality.

Figure 2A:
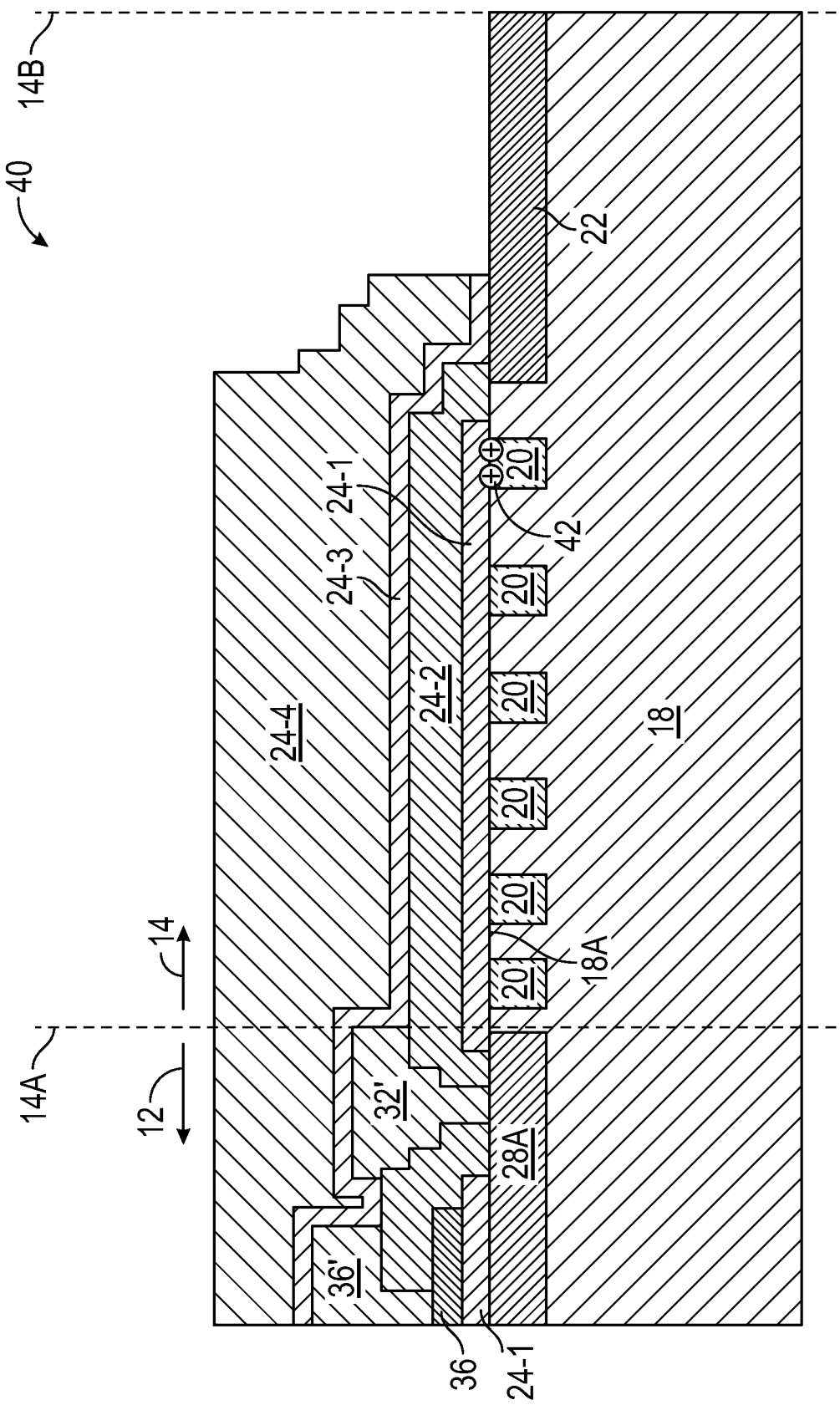
FIG. 2A is a partial cross-sectional view of a semiconductor device that is similar to the semiconductor device of FIG. 1B and provides a more detailed view of the edge termination region.

FIG. 2A is a partial cross-sectional view of a semiconductor device 40 that is similar to the semiconductor device 10 of FIG. 1B and provides a more detailed view of the edge termination region 14. As illustrated, a first passivation layer 24-1 may be formed on the top surface 18A of the drift region 18 and the guard rings 20. The first passivation layer 24-1 may comprise an oxide layer or insulation layer that is formed in the same fabrication step and comprises a same material as the gate oxide layer 34 of FIG. 1B. In certain embodiments, the first passivation layer 24-1 may have a thickness that is greater than a thickness of the gate oxide layer 34 of FIG. 1B. For example, the thickness of the first passivation layer 24-1 may be from 2 times to 100 times the thickness of the gate oxide layer 34 of FIG. 1B. In other embodiments, the first passivation layer 24-1 comprises a different dielectric material than the gate oxide layer 34 of FIG. 1B. In various applications, the first passivation layer 24-1 may be referred to as a field oxide for the semiconductor device 40. A second passivation layer 24-2 may be provided on the first passivation layer 24-1. In certain embodiments, the second passivation layer 24-2 may comprise one or more dielectric layers that serve as inter-metal dielectrics to electrically insulate metal interconnect lines. In the semiconductor device 40, one or more portions of the second passivation layer 24-2 in the active region 12 serve to at least partially define and insulate a gate interconnect 36' and a source interconnect 32'. In this cross-section of FIG. 2A, the source contact (32 of FIG. 1B) is not visible as the source interconnect 32' is configured as a runner or a bus that electrically connects with the source contact (32 of FIG. 1B) in a different portion of the semiconductor device 40. As illustrated, the second passivation layer 24-2 may overlap the first passivation layer 24-1 in a direction toward the outside edge 14B and contact the top surface 18A of the drift region 18 and the surface depletion protection region 22. A third passivation layer 24-3 may be provided over the second passivation layer 24-2, the gate interconnect 36' and the source interconnect 32'. The third passivation layer 24-3 may comprise a dielectric layer such as silicon nitride that can provide a diffusion and/or moisture barrier for the underlying portions of the semiconductor device 40. The third passivation layer 24-3 may overlap the second passivation layer 24-2 in a direction toward the outside edge 14B and contact the top surface 18A of the drift region 18 and the surface depletion protection region 22. Finally, a fourth passivation layer 24-4 may be provided on the third passivation layer 24-3. In certain embodiments, the fourth passivation layer 24-4 may comprise a material with chemical, mechanical, and high temperature stability, for example a polyimide that may provide a scratch-resistant coating for the semiconductor device 40. Additionally, the passivation layers 24-1 to 24-4 may not extend entirely to the outside edge 14B of the edge termination region 14 in order to provide clearance for a saw or scribe street when the semiconductor device 40 was singulated. In the present example, the drift region 18 is an n-type layer while the guard rings 20 are p-type sub-regions, although reverse polarity configurations are also applicable to the present disclosure.

When the semiconductor device 40 is electrically activated, an electric potential from the backside of the drift region (e.g., the drain contact 38 of FIG. 1B) tends to concentrate electric fields along the edge termination region 14. When the semiconductor device 40 is in a blocking mode, voltages supported by the drift region 18 tend to be higher at the outside edge 14B and decrease in a direction toward the inside edge 14A with each of the guard rings 20. In this regard, ions 42 (positive ions in this example) may be attracted to the next lowest potential from the outside edge 14B, for example the sub-region formed by the guard ring 20 that is closest to the outside edge 14B of the edge termination region 14. In this manner, the ions 42 are also attracted into portions of the first passivation layer 24-1 that are on the guard ring 20, thereby altering a trapped charge of the passivation layer 24-1. This can alter an electric field distribution in the underlying semiconductor device 40, thereby providing a source of increased leakage current that can be particularly problematic for higher voltage applications, for example 150 volts (V) or 175 V, and higher associated operating temperatures.

Figure 2B:
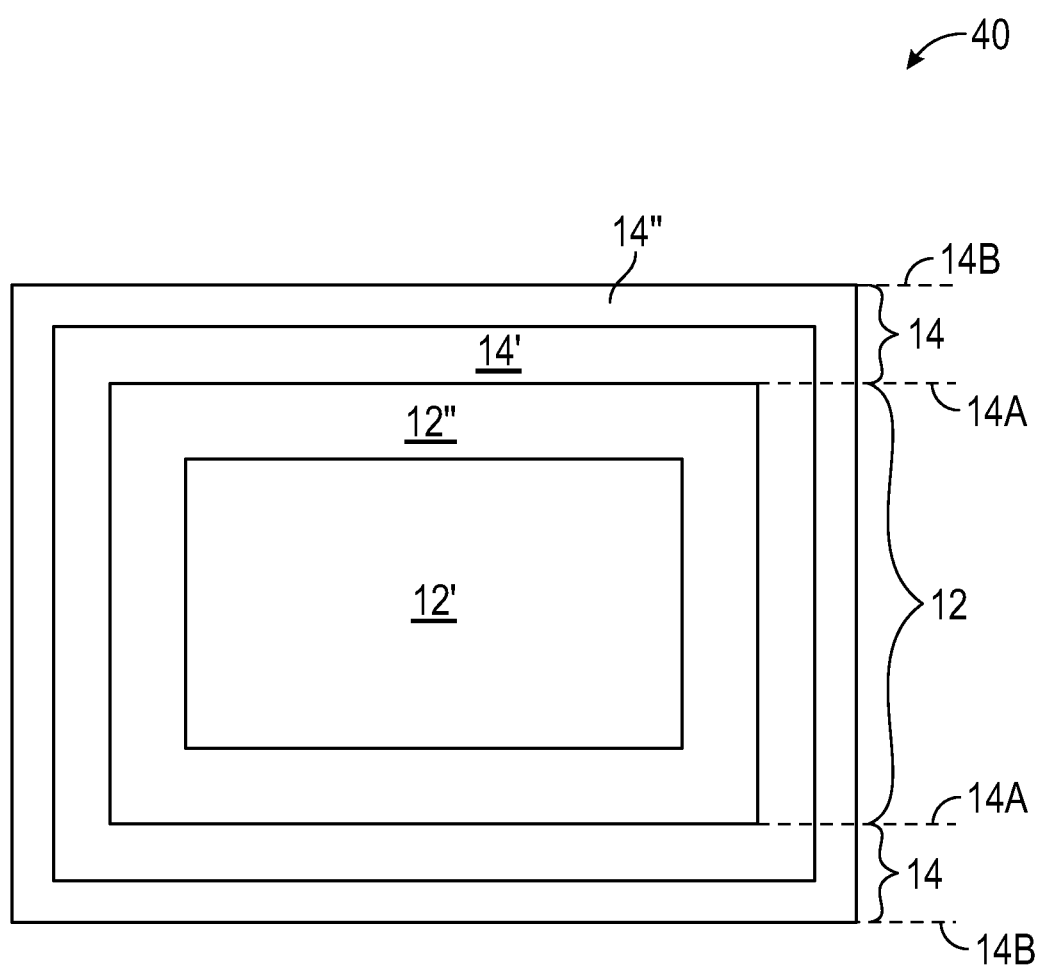
FIG. 2B is a top view illustration of the semiconductor device of FIG. 2A.

FIG. 2B is a top view illustration of the semiconductor device 40 of FIG. 2A. FIG. 2B is provided to generally illustrate the relative location of the edge termination region 14 relative to the active region 12. The active region 12 may include an inner region 12' and an outer region 12". The inner region 12', which may be referred to as a device core, may include the source contacts 32 and gate contacts 36 as illustrated in FIG. 1B, and the outer region 12" may include the gate interconnect 36' and the source interconnect 32' as illustrated in FIG. 2A. The edge termination region 14 may include an inner region 14' and an outer region 14". The outer region 14" is defined where the passivation layers 24-1 to 24-4 of FIG. 2A are not present, thereby forming part of the saw or scribe street as previously described.

Figure 3:
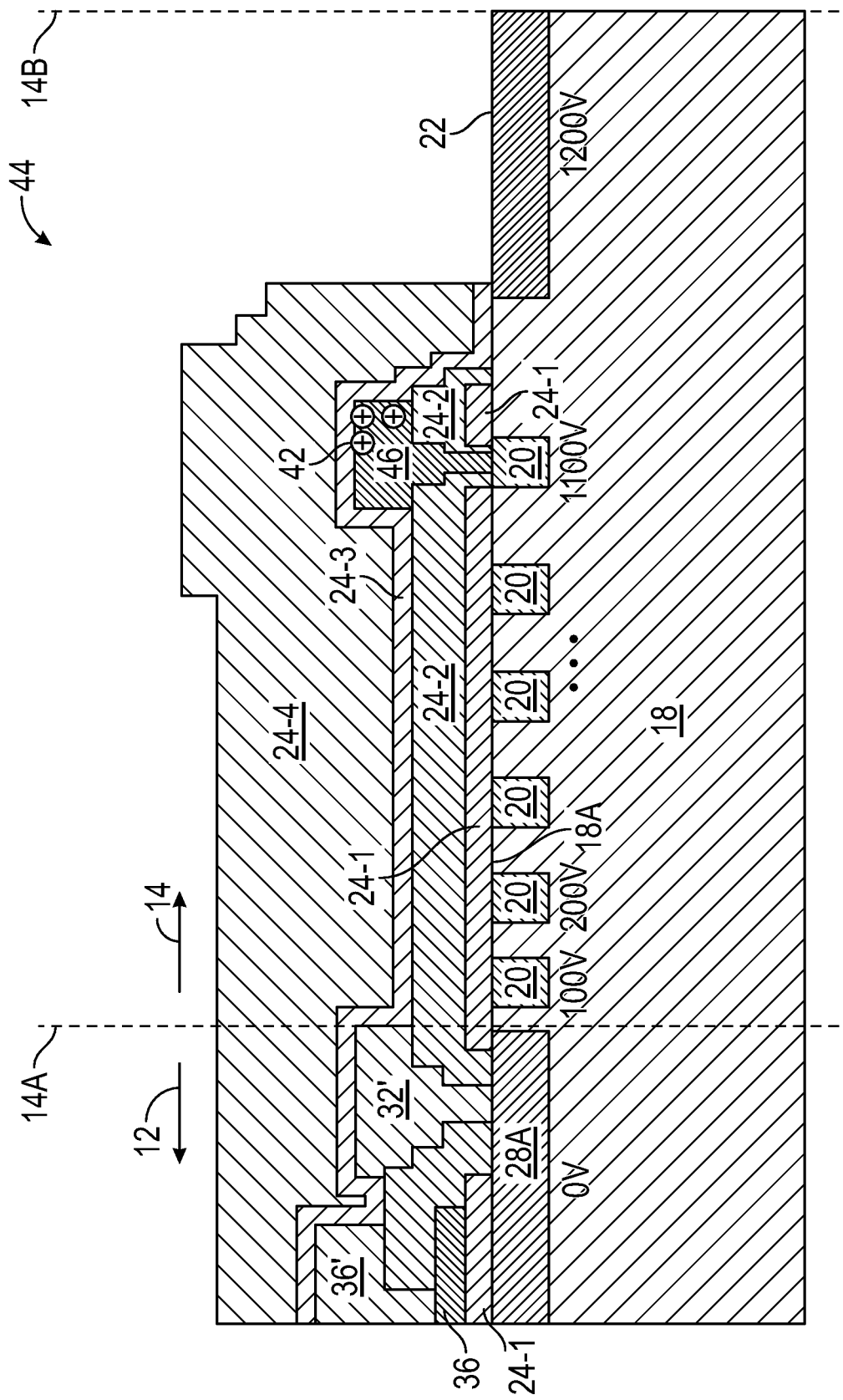
FIG. 3 is a partial cross-sectional view of a semiconductor device that is similar to the semiconductor device of FIG. 2A and further includes an electrode in the edge termination region that is capacitively coupled to the drift region by way of a guard ring.

FIG. 3 is a partial cross-sectional view of a semiconductor device 44 that is similar to the semiconductor device 40 of FIG. 2A and further includes an electrode 46 in the edge termination region 14 that is capacitively coupled to the drift region 18 by way of one of the guard rings 20. As previously described for FIG. 2A, voltages supported by the drift region 18 tend to be higher at the outside edge 14B of the edge termination region 14 and decrease in a direction toward the active region 12 with each of the guard rings 20. By way of example, the semiconductor device 44 is labeled with voltage values representative of a voltage blocking configuration of 1200 V. In this manner, the voltages supported by the drift region 18 progressively decrease toward a 0 V value in the active region 12. For other voltage blocking configurations, for example 650 V, 900 V, 1000 V, and 1700 V, the voltage values in the edge termination region 14 would appropriately scale to different values without deviating from the principles of the present disclosure.

In FIG. 3, the electrode 46 is provided in the edge termination region 14 and electrically connected to the guard ring 20 that is closest to the outside edge 14B. The electrode 46 may be directly connected to the guard ring 20 or connected with one or more intervening conductive layers. In this manner, the electrode 46 is capacitively coupled to the drift region 18 by way of the outermost guard ring 20. Specifically, a capacitance is formed in a forward blocking mode by the semiconductor p-n junction provided by the drift region 18 and the guard ring 20, thereby forming a voltage divider at the outermost guard ring 20. One or more of the passivation layers (24-3 and 24-4 in this example) may surround top and side portions of the electrode 46 so that the electrode 46 is only directly connected to the outermost guard ring 20 and not directly connected to any other electrode of the semiconductor device 44 (e.g., source, drain, and gate). When the semiconductor device 44 is electrically activated, the electrode 46 is biased to the drift region 18 (and drain contact 38 of FIG. 1B) by way of the outermost guard ring 20. This creates a potential difference across the passivation layers 24-1 to 24-4 and serves to draw the ions 42 to the electrode 46 and away from the drift region 18. In this manner, a path is provided for the ions 42 to be attracted and sequestered farther away from the first passivation layer 24-1, thereby reducing associated leakage effects. By coupling the electrode 46 to the outermost guard ring 20, a potential difference is also created relative to the outside edge 14B of the edge termination region 14 where the voltages are highest. In this manner, the electrode 46 is connected to the next lowest potential relative to the outside edge 14B in order to provide a voltage-bias and physical trap for the ions 42 that is away from the drift region 18. If the electrode 46 were connected to the source interconnect 32' (or the source contact 32 of FIG. 1B), the first passivation layer 24-1 would have to drop a full source-to-drain potential, leading to a very high electric field concentration and probable dielectric breakdown. By using the outermost guard ring 20, the electrode 46 is biased to a lower potential with respect to the outside edge 14B of the edge termination region 14 in order to avoid dielectric breakdown. Additionally, by using the outermost guard ring 20, the ions 42 may be trapped by the electrode 46 at a furthest possible distance from the active region 12 while still allowing the electrode 46 to be fully encapsulated by the passivation layers 24-1 to 24-4.

As illustrated in FIG. 3, one or more of the first and second passivation layers 24-1, 24-2 may form an opening to allow the electrode 46 to extend through the passivation layers 24-1, 24-2 in order to connect with the outermost guard ring 20. In certain embodiments, the electrode 46 may form an electrode ring that is registered with the outermost guard ring 20 and arranged around a perimeter of the active region 12. In further embodiments, the electrode 46 may be arranged around an entire perimeter of the active region 12. The electrode 46 may comprise a same material as the gate interconnect 36' and/or the source interconnect 32', for example Al and alloys thereof, and the electrode 46 may be deposited or otherwise formed in a same fabrication step as the gate interconnect 36' and/or the source interconnect 32'.

In other embodiments, the electrode 46 may comprise a different material than the gate interconnect 36' and/or the source interconnect 32'.

Figure 4:
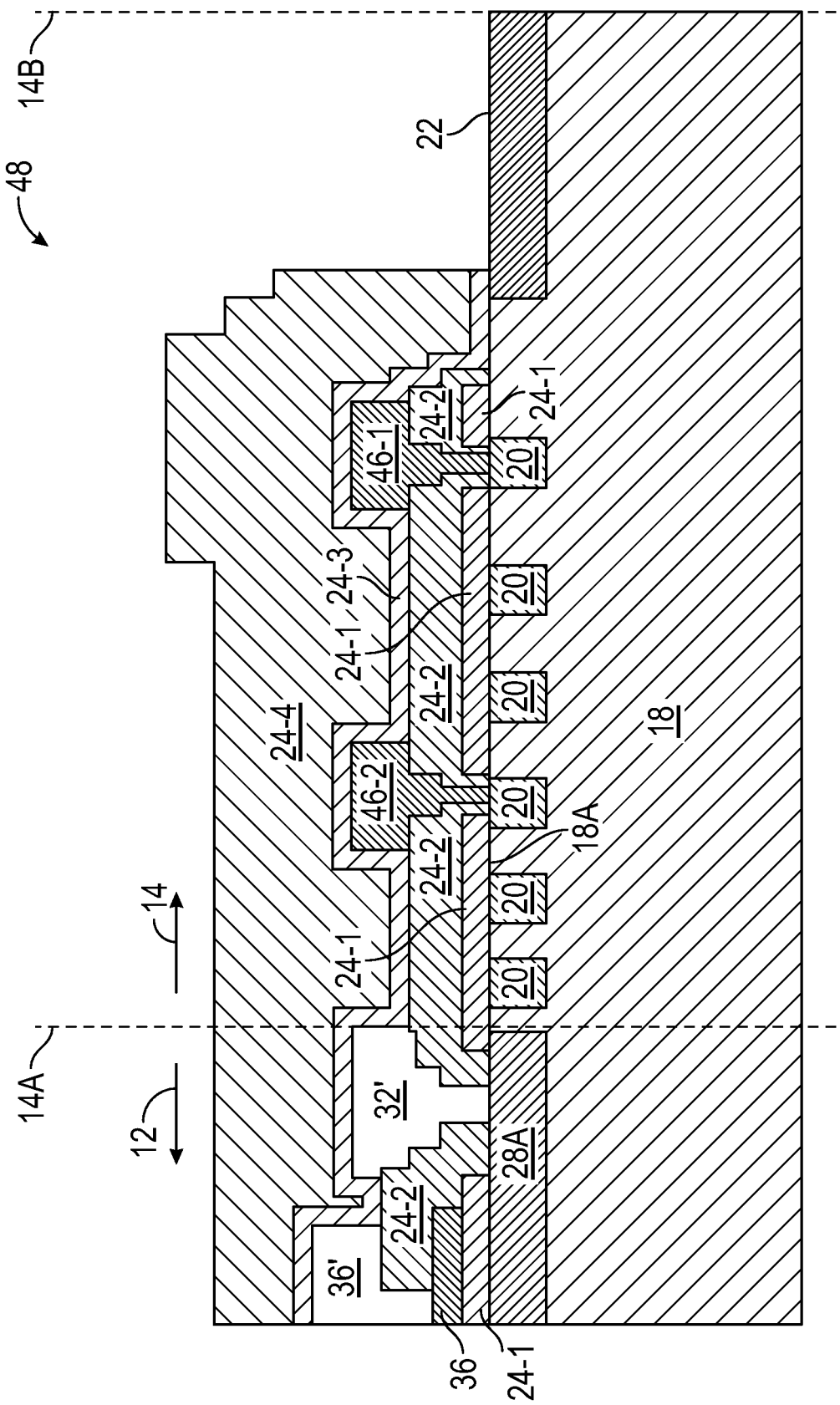
FIG. 4 is a partial cross-sectional view of a semiconductor device that is similar to the semiconductor device of FIG. 3, but includes first and second electrodes that are in the edge termination region and capacitively coupled to the drift region.

FIG. 4 is a partial cross-sectional view of a semiconductor device 48 that is similar to the semiconductor device 44 of FIG. 3, but includes first and second electrodes 46-1, 46-2 that are in the edge termination region 14 and capacitively connected to the drift region 18. In FIG. 4, the first electrode 46-1 is configured the same as described for the electrode 46 of FIG. 3. The second electrode 46-2 is configured in a similar manner to the first electrode 46-1, but the second electrode 46-2 is capacitively coupled to the drift region 18 by way of a different guard ring 20. In this manner, the second electrode 46-2 is connected to a guard ring 20 that is between the outermost guard ring 20 that is connected to the first electrode 46-1 and the active region 12. Accordingly, the second electrode 46-2 provides a potential relative to the outside edge 14B that is lower than the first electrode 46-1 in order to provide a voltage-bias and physical trap for ions that may not be trapped by the first electrode 46-1. By way of example, the second electrode 46-2 is illustrated as being connected to the guard ring 20 that is the fourth guard ring 20 from the outside edge 14B of the edge termination region 14. In further embodiments, the second electrode 46-2 may be connected to any other guard ring 20 aside from the outermost guard ring 20 without deviating from principles of the present disclosure. Additionally, the semiconductor device 48 may further include more electrodes connected to other guard rings 20 in a similar manner as the first and second electrodes 46-1, 46-2. In still further embodiments, each one of the guard rings 20 may be connected to a separate electrode in a similar manner as illustrated for the first and second electrodes 46-1, 46-2.

Figure 5:
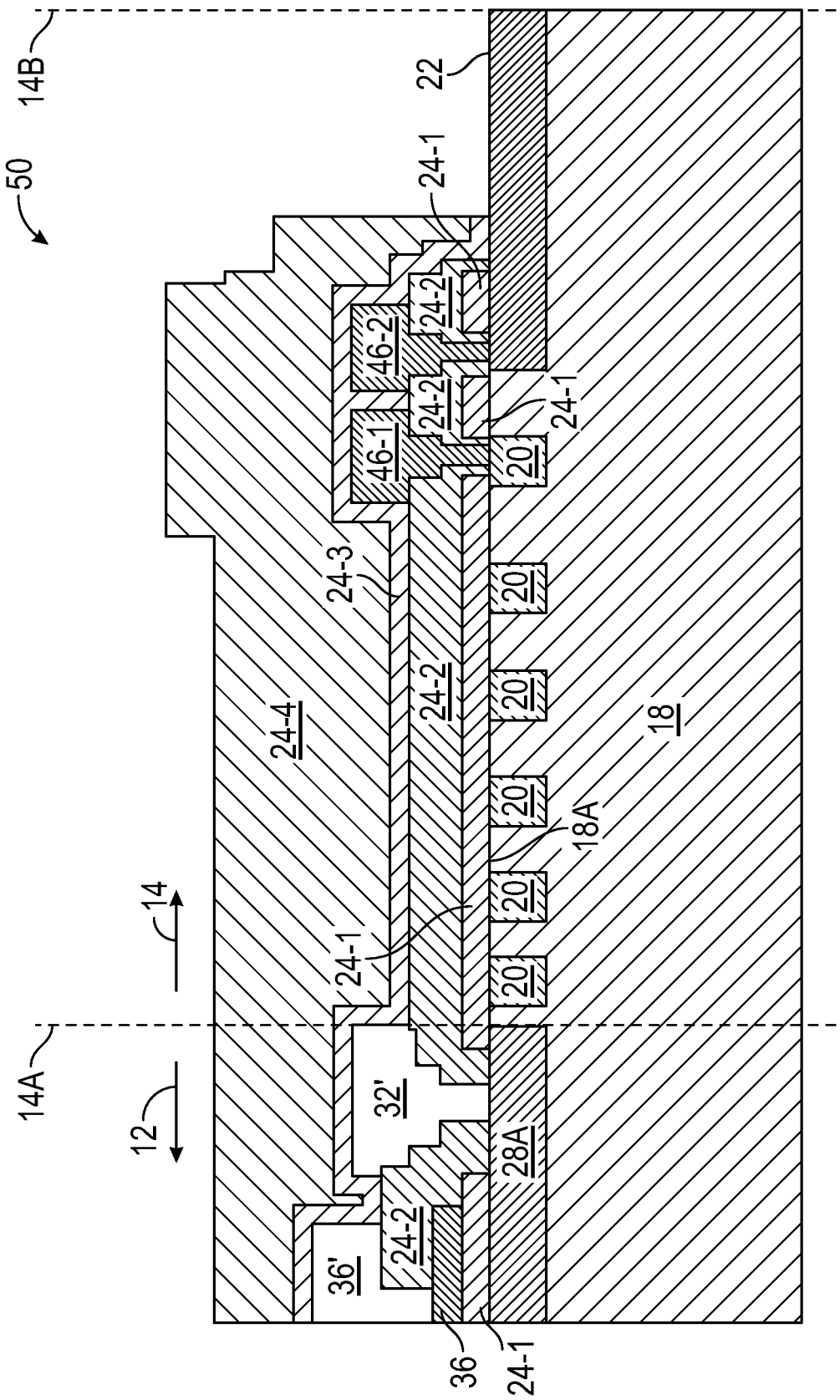
FIG. 5 is a partial cross-sectional view of a semiconductor device that is similar to the semiconductor device of FIG. 4, but where the first electrode is capacitively coupled to the drift region and the second electrode is held at a drain potential of the semiconductor device.

FIG. 5 is a partial cross-sectional view of a semiconductor device 50 that is similar to the semiconductor device 48 of FIG. 4, but where the first electrode 46-1 is capacitively coupled to the drift region 18 and the second electrode 46-2 is held at a drain potential of the semiconductor device 50. In this regard, the second electrode 46-2 is connected to the drift region 18 outside a periphery of the outermost guard ring 20. The second electrode 46-2 may be directly connected with the surface depletion protection region 22 or directly connected with the drift region 18 if the surface depletion protection region 22 is not present. In other embodiments, the second electrode 46-2 may be connected with one or more of the surface depletion protection region 22 and the drift region 18 by one or more intervening conductive layers. The first electrode 46-1 may be capacitively coupled to the drift region 18 by way of the outmost guard ring 20 as previously described. In this manner, the second electrode 46-2 is configured at the drain potential while the first electrode 46-1 is configured at the next lowest potential and both the first and second electrodes 46-1, 46-2 may serve to attract and segregate ions away from the first passivation layer 24-1 and the active region 12. In certain embodiments, portions of the first passivation layer 24-1 and the second passivation layer 24-2 may form an opening so that portions of the second electrode 46-2 extend through the passivation layers 24-1, 24-2 in order to connect with the surface depletion protection region 22.

Figure 6:
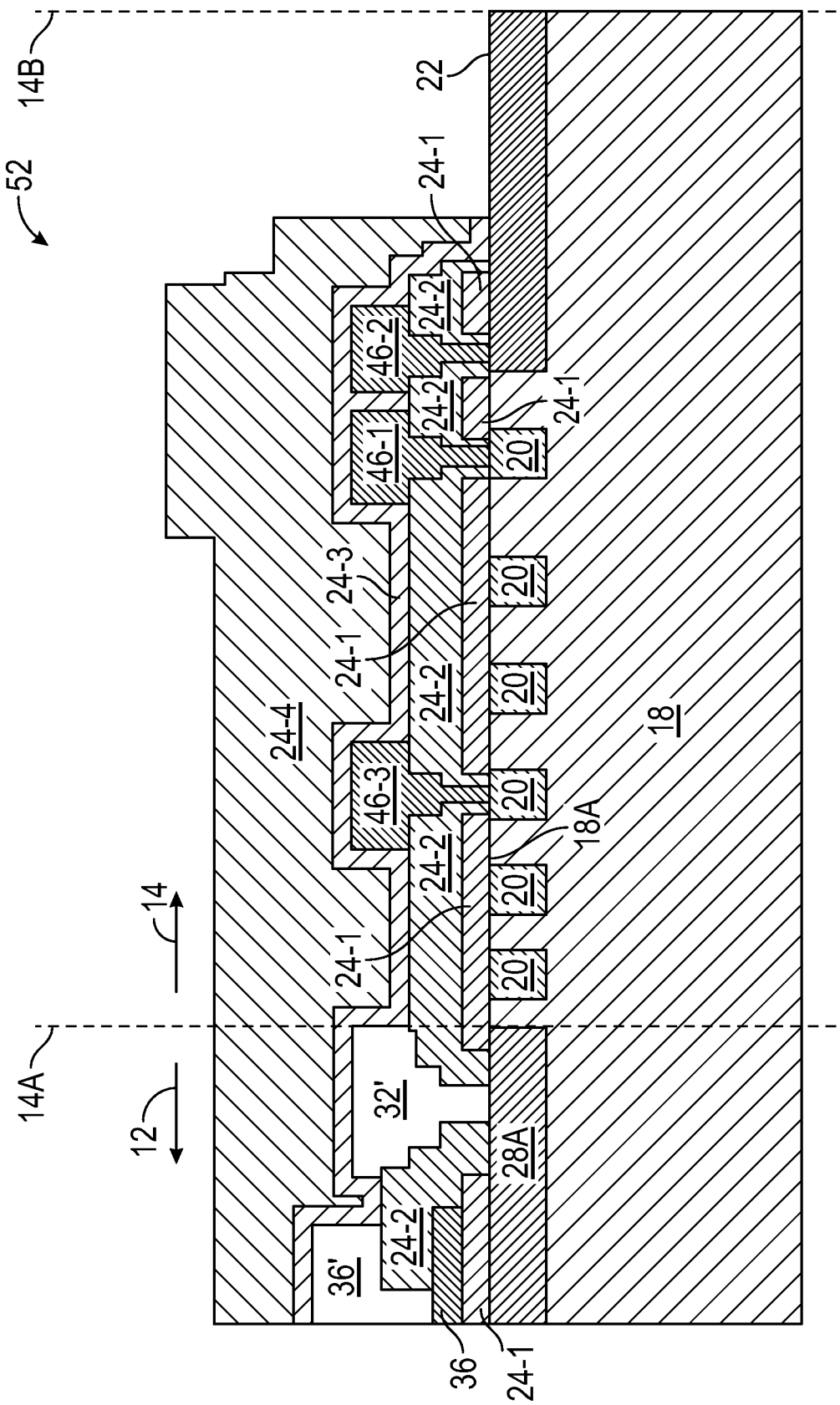
FIG. 6 is a partial cross-sectional view of a semiconductor device that is similar to the semiconductor device of FIG. 5, but where the second electrode is held at a drain potential and the first electrode and a third electrode are capacitively coupled to the drift region.

FIG. 6 is a partial cross-sectional view of a semiconductor device 52 that is similar to the semiconductor device 50 of FIG. 5, but where the second electrode 46-2 is held at a drain potential of the semiconductor device 52 and the first electrode 46-1 and a third electrode 46-3 are capacitively coupled to the drift region 18. The third electrode 46-3 is configured in a similar manner to the first electrode 46-1, but the third electrode 46-3 is capacitively coupled to the drift region 18 by way of a different guard ring 20 that is between the outermost guard ring 20 and the active region 12. Accordingly, the third electrode 46-3 provides a potential relative to the outside edge 14B that is lower than the first electrode 46-1 and the second electrode 46-2 in order to provide a voltage-bias and physical trap for ions that may not be trapped by the first electrode 46-1 or the second electrode 46-2. By way of example, the third electrode 46-3 is illustrated as being connected to the guard ring 20 that is the fourth guard ring 20 from the outside edge 14B of the edge termination region 14. In further embodiments, the third electrode 46-3 may be connected to any other guard ring 20 aside from the outermost guard ring 20 without deviating from principles of the present disclosure.

Figure 7:
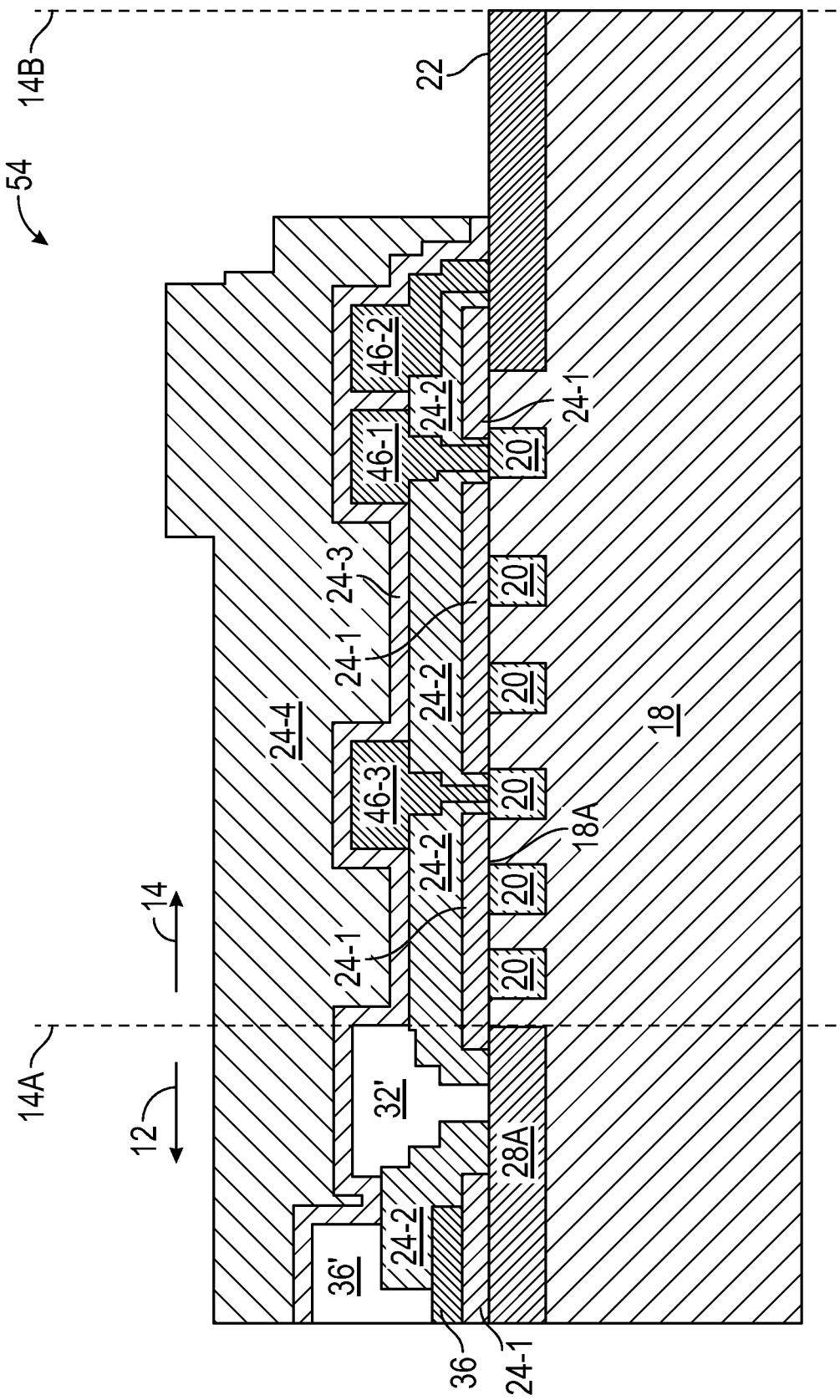
FIG. 7 is a partial cross-sectional view of a semiconductor device that is similar to the semiconductor device of FIG. 6, but where the second electrode is connected to a surface depletion protection region that is outside a peripheral edge of first and second passivation layers.

FIG. 7 is a partial cross-sectional view of a semiconductor device 54 that is similar to the semiconductor device 52 of FIG. 6, but where the second electrode 46-2 is connected to the surface depletion protection region 22 outside a peripheral edge of the first and second passivation layers 24-1, 24-2. Rather than extending through an opening in the first and second passivation layers 24-1, 24-2 as illustrated in FIG. 6, the second electrode 46-2 may be formed in a conformal manner on and extending past the passivation layers 24-1, 24-2 to connect with the surface depletion protection region 22. The semiconductor device 54 may otherwise function in a similar manner as the semiconductor device 52 of FIG. 6. In further embodiments, the arrangement of the second electrode 46-2 in FIG. 7 may also be applicable to the second electrode 46-2 of the semiconductor device 50 of FIG. 5 or any other semiconductor device arrangement that includes an electrode connected to the drain potential.

Figure 8:
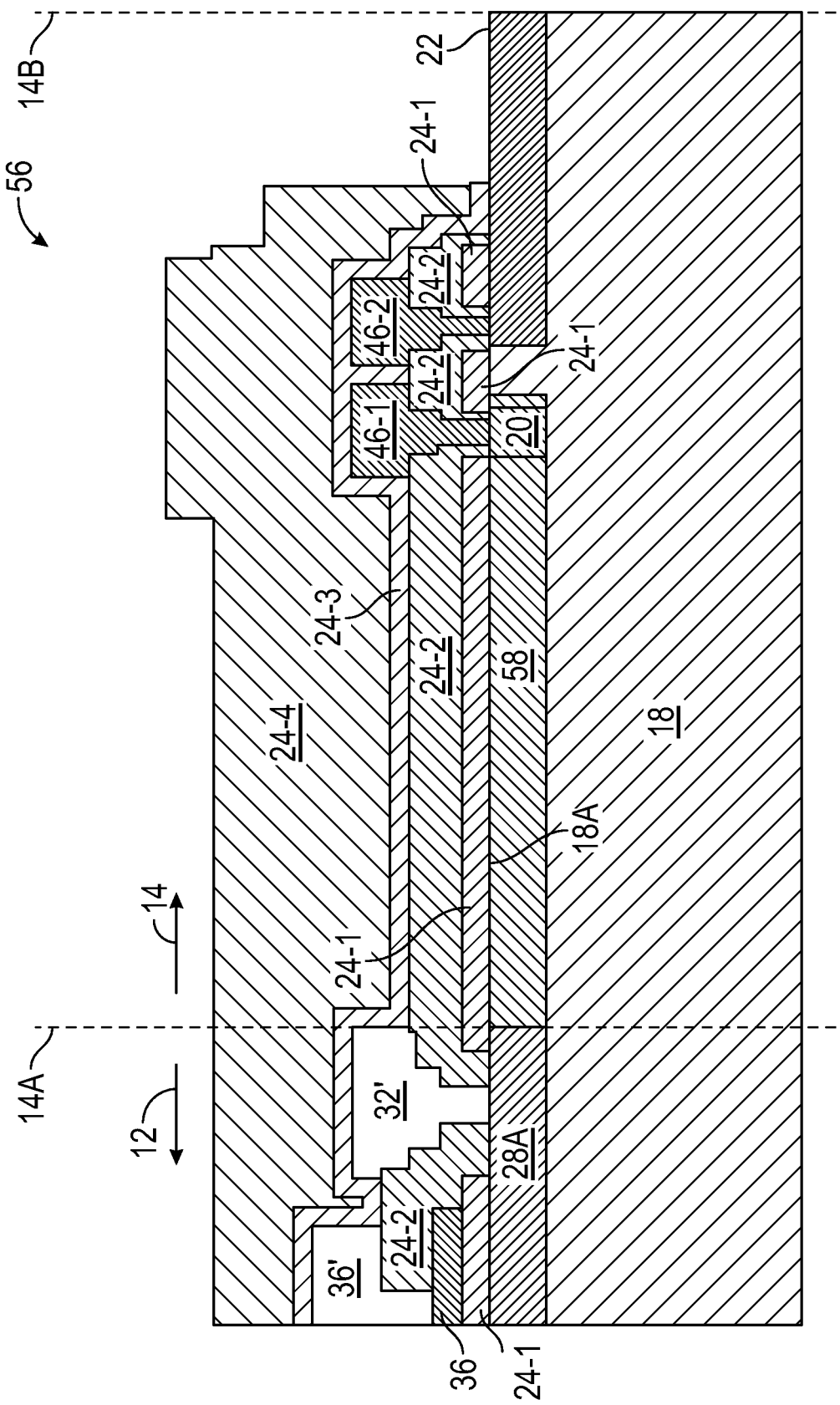
FIG. 8 is a partial cross-sectional view of a semiconductor device that is similar to the semiconductor device of FIG. 5, but for embodiments where the edge termination region includes a junction termination extension (JTE) in the drift region.

FIG. 8 is a partial cross-section view of a semiconductor device 56 that is similar to the semiconductor device 50 of FIG. 5, but for embodiments where the edge termination region 14 includes a junction termination extension (JTE) 58 in the drift region 18. The JTE 58 may comprise a doping type that is the same as the first well region 28A, thereby forming a sub-region in the drift region 18 having an opposite doping type from the drift region 18. The JTE 58 may be provided in place of or in combination with one or more of the guard rings 20 as previously described. The JTE 58 may be formed by ion implantation and may surround a perimeter of the active region 12 in a similar manner to the previously-described guard rings 20. The implants used to form the JTE 58 may include aluminum, boron, or any other suitable p-type dopant when the semiconductor device 56 is configured with n-type conductivity for the drift region 18. The JTE 58 may be provided to reduce electric field crowding in the edge termination region 14. In the example of FIG. 8, the JTE 58 extends from the inside edge 14A of the edge termination region 14 toward the outside edge 14B along the top surface 18A of the drift region 18. In certain embodiments, the JTE 58 includes a doping concentration that is graded in a lateral direction such that the doping concentration progressively increases from the inside edge 14A toward the outside edge 14B. In other embodiments, the JTE 58 may include a uniform doping concentration. As illustrated, one or more of the guard rings 20 may be provided to connect with the first electrode 46-1. In such embodiments, the doping concentration of the JTE 58 may be less than the doping concentration of the guard ring 20. In other embodiments, the first electrode 46-1 may be connected to the JTE 58 without the guard ring 20. In still further embodiments, one or more additional electrodes may be connected to the JTE 58 in locations between the first electrode 46-1 and the active region 12. In FIG. 8, the second electrode 46-2 is configured at the drain potential as previously described. In other embodiments, such an electrode may be omitted based on a voltage configuration for the semiconductor device 56.

While the present disclosure provides exemplary embodiments that include MOSFETs, the principles of the present disclosure are also applicable to edge termination structures in other semiconductor devices, for example diodes, Schottky diodes, JBS diodes, PiN diodes, and IGBTs, among others. Semiconductor devices of the present disclosure may embody wide band gap semiconductor devices, for example SiC-based devices.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
a drift region comprising a first doping type;
an active region comprising a portion of the drift region;
a gate insulating layer on the drift region in the active region;
an edge termination region in the drift region and arranged along a perimeter of the active region, the edge termination region comprising a sub-region of a second doping type that is opposite the first doping type;
a first passivation layer on the edge termination region, wherein the first passivation layer comprises a first thickness that is greater than a second thickness of the gate insulating layer;
a second passivation layer on the first passivation layer, wherein the second passivation layer comprises a different material than the first passivation layer; and
a first electrode that extends through the first passivation layer and the second passivation layer to be electrically connected to the sub-region, wherein the first electrode is capacitively coupled to the drift region when the semiconductor device is electrically activated.

2. The semiconductor device of claim 1, wherein the sub-region is a first sub-region of a plurality of sub-regions, and the first sub-region is arranged closer to a peripheral edge of the drift region than any other sub-region of the plurality of sub-regions.

3. The semiconductor device of claim 1, wherein the first electrode forms an electrode ring that is arranged around the perimeter of the active region.

4. The semiconductor device of claim 1, wherein the first passivation layer forms an opening and the first electrode contacts the sub-region through the opening.

5. The semiconductor device of claim 1, further comprising an additional passivation layer on the first passivation layer and on the second passivation layer, wherein the first electrode is arranged between the additional passivation layer and the drift region.

6. The semiconductor device of claim 1, wherein the sub-region comprises a first guard ring in the edge termination region.

7. The semiconductor device of claim 6, wherein the first guard ring is one of a plurality of guard rings in the edge termination region.

8. The semiconductor device of claim 7, wherein the first guard ring of the plurality of guard rings is arranged closer to a peripheral edge of the drift region than any other guard ring of the plurality of guard rings.

9. The semiconductor device of claim 7, further comprising a second electrode that is connected to a second guard ring of the plurality of guard rings, wherein the second electrode is capacitively coupled to the drift region when the semiconductor device is electrically activated.

10. The semiconductor device of claim 7, further comprising:
a second electrode that is connected to the drift region outside a periphery of the plurality of guard rings, wherein the second electrode is coupled to a drain potential when the semiconductor device is electrically activated; and
a third electrode that is connected to a second guard ring of the plurality of guard rings, wherein the third electrode is capacitively coupled to the drift region when the semiconductor device is electrically activated.

11. The semiconductor device of claim 7, further comprising a second electrode that is connected to the drift region outside a periphery of the plurality of guard rings, wherein the second electrode is coupled to a drain potential when the semiconductor device is electrically activated.

12. The semiconductor device of claim 11, further comprising:
a surface depletion protection region in the edge termination region, the surface depletion protection region comprising the first doping type with a higher doping concentration than the drift region;
wherein the second electrode is connected to the surface depletion protection region.

13. The semiconductor device of claim 12, wherein the first passivation layer forms an opening and wherein the second electrode contacts the surface depletion protection region through the first passivation layer.

14. The semiconductor device of claim 12, wherein the second electrode contacts the surface depletion protection region outside a peripheral edge of the first passivation layer.

15. The semiconductor device of claim 1, wherein the sub-region comprises a junction termination extension.

16. The semiconductor device of claim 15, wherein the sub-region further comprises one or more guard rings.

17. The semiconductor device of claim 1, wherein the drift region comprises silicon carbide (SiC).

18. The semiconductor device of claim 1, wherein the active region comprises a silicon carbide (SiC) metal-oxide-semiconductor field-effect-transistor (MOSFET).

19. A semiconductor device comprising:
a drift region comprising a first doping type;
an active region comprising a portion of the drift region;
an edge termination region in the drift region and arranged along a perimeter of the active region, the edge termination region comprising a plurality of sub-regions of a second doping type that is opposite the first doping type;
a first passivation layer on the edge termination region, the first passivation layer forming an opening that is registered with a first sub-region of the plurality of sub-regions, wherein the first passivation layer is arranged to laterally extend from the opening to entirely cover the remainder of the plurality of sub-regions;

a second passivation layer on the first passivation layer; and a first electrode electrically connected to the first sub-region through the opening of the first passivation layer, wherein the first sub-region of the plurality of sub-regions is an outermost of the plurality of sub-regions.

20. The semiconductor device of claim 19, wherein the first passivation layer and the second passivation layer form the opening.

21. The semiconductor device of 21, further comprising a third passivation layer on the second passivation layer, wherein the third passivation layer covers the first electrode.

22. The semiconductor device of claim 21, further comprising a fourth passivation layer on the third passivation layer.

23. The semiconductor device of claim 22, wherein one or more of the first passivation layer and the second passivation layer comprises an oxide, the third passivation layer comprises silicon nitride, and the fourth passivation layer comprises a polyimide.

24. The semiconductor device of claim 19, wherein the first sub-region comprises a first guard ring in the edge termination region.

25. The semiconductor device of claim 24, wherein the first guard ring is one of a plurality of guard rings in the edge termination region, and the first guard ring of the plurality of guard rings is arranged closer to a peripheral edge of the drift region than any other guard ring of the plurality of guard rings.

26. The semiconductor device of claim 19, wherein the first sub-region comprises a junction termination extension.

27. The semiconductor device of claim 19, wherein an edge of the first passivation layer forms at least a portion of the opening.

* * * * *

UNITED STATES PATENT AND TRADEMARK OFFICE
CERTIFICATE OF CORRECTION

PATENT NO. : 11,600,724 B2
APPLICATION NO. : 17/031365
DATED : March 7, 2023
INVENTOR(S) : Van Brunt et al.

It is certified that error appears in the above-identified patent and that said Letters Patent is hereby corrected as shown below:

In the Claims

Column 15, Line 11, Claim 21: Please correct "device of 21" to read --device of claim 20--

Signed and Sealed this
Twenty-seventh Day of June, 2023

Katherine Kelly Vidal
*Director of the United States Patent and Trademark Office*